United States Patent [19]

Lazarek et al.

[11] 4,268,850

[45] May 19, 1981

[54] FORCED VAPORIZATION HEAT SINK FOR SEMICONDUCTOR DEVICES

[75] Inventors: Gerald M. Lazarek; Fred W. Staub, both of Schenectady, N.Y.

[73] Assignee: Electric Power Research Institute, Palo Alto, Calif.

[21] Appl. No.: 38,115

[22] Filed: May 11, 1979

[51] Int. Cl.³ .................... H01L 25/04; H01L 23/42; H01L 23/44

[52] U.S. Cl. ............................. 357/82; 174/16 HS; 165/80 C; 357/79

[58] Field of Search ............................ 357/81, 82, 79; 174/16 HS; 165/80

[56] References Cited

U.S. PATENT DOCUMENTS

| | | | |
|---|---|---|---|
| 2,917,685 | 12/1959 | Wiegand | 357/82 |
| 3,013,191 | 12/1961 | Connell | 357/82 |
| 3,652,903 | 3/1972 | Eriksson et al. | 357/82 |
| 3,918,084 | 11/1975 | Schierz | 357/82 |
| 4,051,509 | 9/1977 | Beriger et al. | 357/82 |
| 4,079,410 | 3/1978 | Schierz | 357/82 |
| 4,138,692 | 2/1979 | Meeker et al. | 357/82 |

FOREIGN PATENT DOCUMENTS

| | | | |
|---|---|---|---|
| 1289341 | 2/1962 | France | 357/82 |
| 6606526 | 12/1966 | Netherlands | 357/82 |

*Primary Examiner*—Andrew J. James
*Attorney, Agent, or Firm*—Flehr, Hohbach, Test, Albritton & Herbert

[57] ABSTRACT

A fluid cooled heat sink is provided for use in cooling high power semiconductor devices. The heat sink includes a body formed of thermally conductive material having internal fluid passageways. Cooling fluid from an external source is passed through the heat sink. The preferred heat sink includes a pair of manifolds and means cooperating with the manifolds to allow selective interconnection of the interior passageways of the heat sink.

15 Claims, 6 Drawing Figures

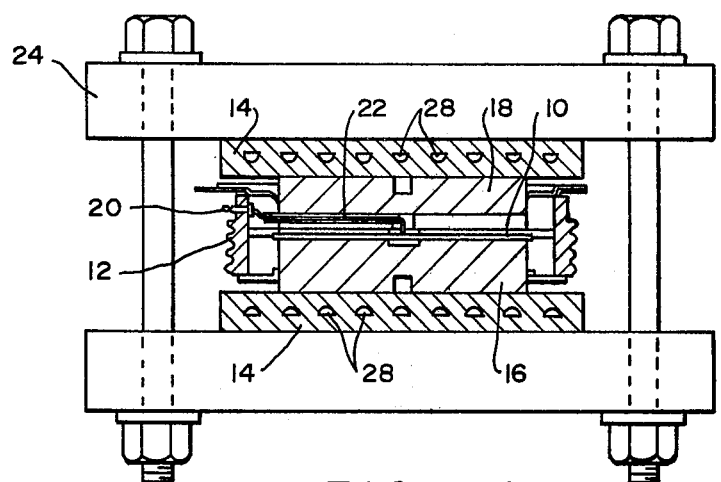
FIG.—1
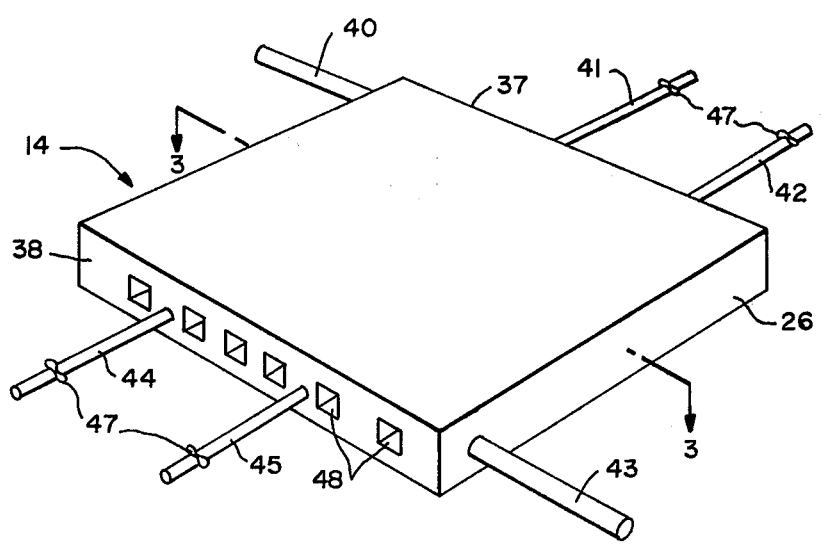
FIG.—2

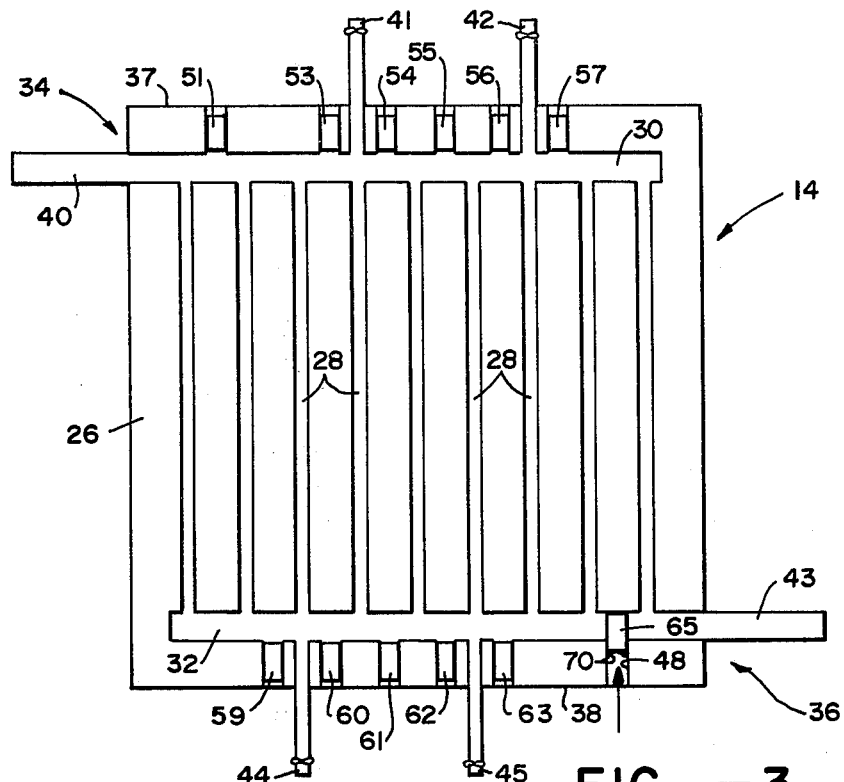
FIG.—3
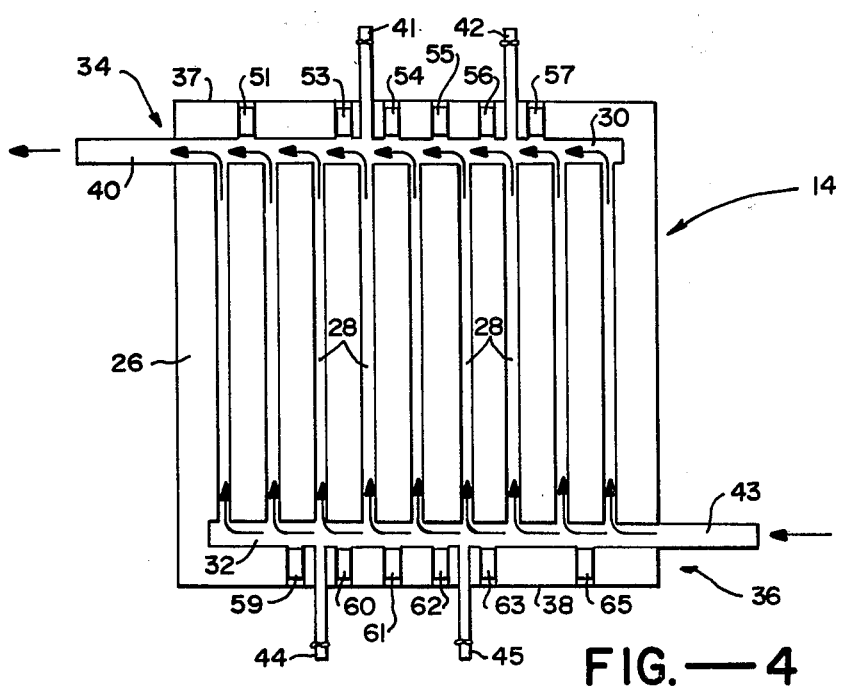
FIG.—4

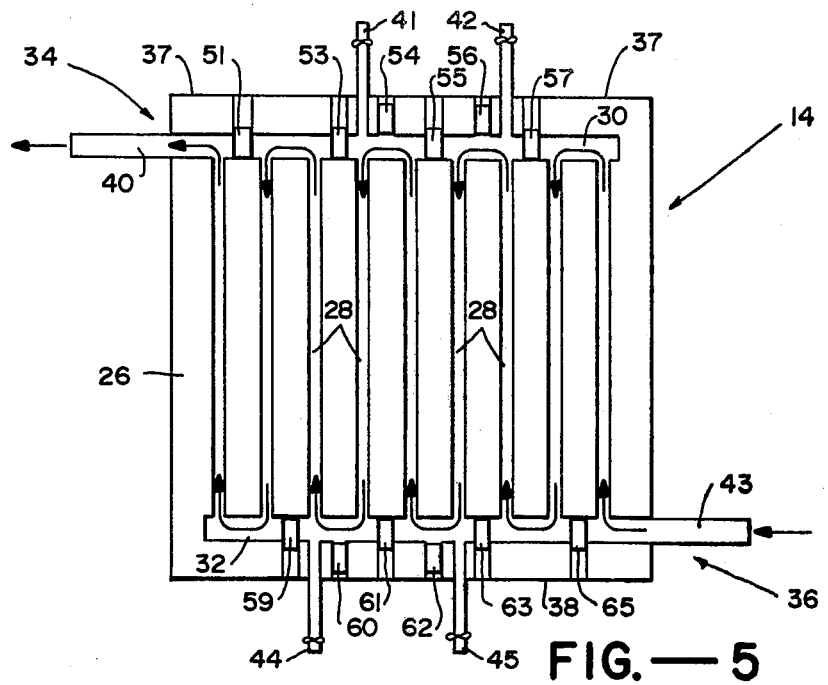
FIG.—5
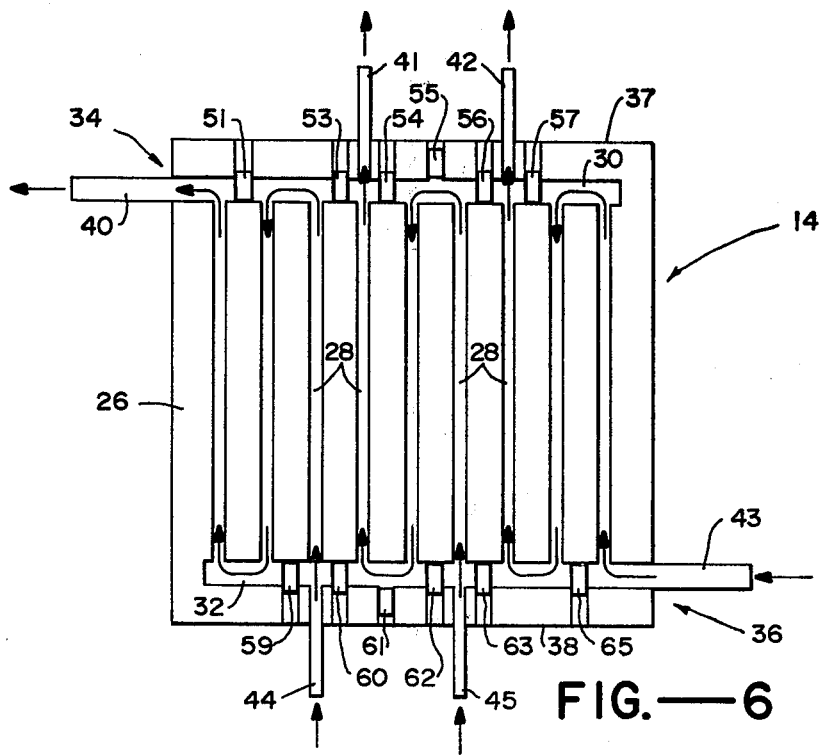
FIG.—6

FORCED VAPORIZATION HEAT SINK FOR SEMICONDUCTOR DEVICES

The invention relates to heat sinks for use in cooling high power semiconductor devices and more specifically to semiconductor heat sinks which employ fluid cooling.

Continuing research into semiconductor switching devices has led to the development of thyristors and other related devices capable of switching currents of thousands of amperes. Such devices have many useful applications, particularly in the transmission and distribution of electric power where thyristors can be employed in AC/DC switching of power from high voltage direct current transmission lines. A typical power substation might incorporate hundreds of high power thyristors for this purpose. An important consideration in the development of high power thyristors is the need for improved cooling systems to remove the potentially self-destructive heat generated by the thyristors.

High power thyristors are typically sealed in packages mounted in high pressure clamps. To remove the heat generated by the thyristor, metal heat exchangers are positioned between the pressure clamp and the thyristor package, generally on both faces of the device if the cooling requirements are high. The heat exchangers or heat sinks are cooled by liquid in high power applications. Examples of liquid-cooled heat sinks for high power thyristors include General Electric's Models G5 and G6 heat exchangers.

As power handling capacity of thyristor devices is increased, improved heat sinks and associated cooling systems must be developed. One promising area of development includes the use of two-phase coolant in the fluid passageways of the heat sink. The two-phase system employs forced vaporization cooling, where liquid coolant at a given pressure is introduced into the heat sink passageways at or near its saturation temperature. The liquid is vaporized as the coolant passes through the heat sink. The development of a practical forced vaporization cooling system for thyristors required extensive experimentation to determine the proper temperatures, pressures and fluid-flow configurations for effective operation. The heat sink passageways must be tailored to maintain proper pressure variation and heat transfer parameters.

When conducting experiments with heat sinks it is time-consuming and expensive to remake the necessary heat sinks each time a different fluid-flow configuration is to be tested. It is also expensive to fabricate heat sinks which are individually tailored to the requirements of a particular thyristor installation.

It is a general object of the present invention to provide a fluid cooled heat sink for use in cooling high power semiconductor devices in which the flow of fluid through the heat sink can be conveniently changed to satisfy the cooling requirements of particular devices.

Another object of the invention is to provide a fluid cooled heat sink which is suitable for forced vaporization cooling of high power semiconductor devices.

Another object of the invention is to provide a fluid cooled heat sink for use in cooling high power semiconductor devices which can be conveniently adjusted to provide various fluid-flow configurations through the heat sink.

Accordingly, a fluid cooled heat sink is provided for use in cooling high power semiconductor devices. The heat sink comprises a body formed of thermally conductive material. A plurality of fluid passageways are provided in the body. Manifold means communicate with the passageways and means cooperating with the manifold means selectively interconnect the passageways to provide various fluid-flow configurations through the body.

A preferred embodiment of the invention is described in detail below with reference being made to the accompanying drawings, in which:

FIG. 1 is a plan view in partial cross section showing a thyristor device mounted in a high-pressure clamp together with heat sinks according to the present invention.

FIG. 2 is a perspective view of one of the heat sinks shown in FIG. 1.

FIG. 3 is a horizontal sectional view taken along lines 3—3 of FIG. 2.

FIG. 4 is a horizontal sectional view as in FIG. 3 showing one fluid-flow configuration of the heat sink.

FIG. 5 is a horizontal sectional view as in FIG. 3 showing an alternative fluid-flow configuration through the heat sink.

FIG. 6 is a horizontal sectional view as in FIG. 3 showing another alternative fluid-flow configuration through the heat sink.

A typical mounting arrangement for a single high power thyristor is shown in FIG. 1. The thyristor 10 is hermetically sealed in a package 12 between a pair of fluid cooled heat sinks 14 of the present invention. The heat sinks include a number of fluid-flow passageways through which a coolant is pumped from an external refrigeration system or other source of coolant (not shown). The package 12 is of the type which can accommodate large compressive forces commonly known as a press pak. The package includes electrically conductive pole pieces 16 and 18 which contact the thyristor 10 and through which heat is conducted from the thyristor to heat sinks 14. Pole pieces 16 and 18 provide the thyristor anode and cathode connections, and a thyristor gate connection is made to terminal 20 by way of wire 22, as is well known in the art. A conventional mounting clamp 24 exerts a compressive force on the thyristor package.

Additional views of heat sinks 14 are shown in FIGS. 2 and 3. Each heat sink includes a body 26 formed of a thermally conductive material such as aluminum or copper in the shape of a thin rectangular block. A plurality of mutually parallel fluid passageways 28 are formed in the body. As shown in FIG. 1, the passageways 28 have a semicircular cross section. The shape of the passageways is a matter of design choice based on the heat transfer requirements for the heat sink, cooling fluid pressure, flow rate, and other factors. It should therefore be understood that the semicircular shape illustrated is suggestive only, and that passageways with other shapes may be used with the present invention.

Extending along opposite sides of the heat sink are manifold passages 30 and 32 which communicate with passageways 28. The manifold passages form part of first and second manifold means 34 and 36, respectively, extending along and generally parallel to first and second sides 37 and 38 of body 26. Fluid passageways 28 extend generally perpendicular to the manifold passages and open at each end into the manifold passages.

A plurality of inlet and outlet ports 40, 41, 42, 43, 44 and 45 are provided through which a cooling fluid can enter and exit the heat sink. The ports communicate with manifold passages 30 and 32. In the preferred embodiment, the ports include tubular connectors extending from the body as shown in the figures, to which fluid connections are made. At least some of the tubular connectors are preferably formed of a malleable material which permits selected ports to be closed by pinching off the connectors. In the preferred embodiment the ports specifically adapted to be closed in this manner are 41, 42, 44 and 45. Those ports are shown as closed by pinching at points 47 in FIG. 2.

Cooperating with the manifolds 34 and 36 are a plurality of movable plugs disposed in openings 48 along first and second sides 37 and 38 of body 26. The plugs, designated 51, 53, 54, 55, 56, 57, 59, 60, 61, 62, 63 and 65, are spaced along the manifold passages between the fluid passageways 28. Each plug is independently movable into a blocking position wherein the plug prevents fluid communication between selected fluid passageways 28 by blocking a portion of the manifold passage. In FIG. 3, plug 65 is illustrated in the blocking position. The plugs should be at least as large as manifold passages 30 and 32 so as to completely block the passages. By positioning selected plugs in their blocking positions, the manifolds are modified, allowing various fluid-flow configuration to be provided through the heat sink. The plugs are preferably formed of the same material as is body 26 and can assume any shape. In the preferred embodiment the plugs are illustrated as being rectangular.

Each plug is accessible from outside the heat sink body through openings 48 to permit convenient movement of selected plugs into the blocking position. Access to the plugs is accomplished by inserting a tapered or elongated object into the opening 48 of the plug to be moved, and then pushing the plug inwardly. To secure the plug in the blocking position a small amount of solder can be deposited on the outer end, in the body opening 48, as shown in FIG. 3, at 70. Assuming that the plugs fit relatively tightly in their openings, it is not expected that seals or other devices for preventing coolant leakage will be required. It is anticipated that the application of solder on the end of each plug will provide a sufficient seal. It is probably advisable to also apply solder to the ends of the plugs which are not in the blocking position. The solder will prevent the plugs from being forced out of their openings by the pressurized coolant within the manifold passages.

The heat sinks of the present invention are preferably fabricated in several separate sections which are permanently joined together in any conventional manner (not shown). For example, the central portion containing fluid passageways 28 would constitute one section, with the manifolds being made separately to facilitate formation of the numerous openings and passages required.

Use of the heat sink of the present invention is illustrated in FIGS. 4, 5 and 6, where examples of three different fluid-flow configurations are shown. FIG. 4 shows the all parallel flow configuration which is created by closing ports 41, 42, 44 and 45 and by leaving all the plugs in the open position. Fluid connections for coolant are made to ports 40 and 43 only.

FIG. 5 shows the all series flow configuration. Ports 41, 42, 44 and 45 are closed, and all plugs designated by odd numbers (51, 53, 55, 57, 59, 61, 63 and 65) are moved into their blocking position. Fluid connections are made to ports 40 and 43 only.

The heat sink also allows for mixed series/parallel flow with three fluid circuits in parallel and each circuit having three passes, as shown in FIG. 6. All inlet and outlet ports 40, 41, 42, 43, 44 and 45 are left open. Plugs 51, 53, 54, 56, 57, 59, 60, 62, 63 and 65 are moved to their blocking positions, leaving only plugs 55 and 61 open. Inlet connections are made between a source of cooling fluid and ports 43, 44 and 45. Outlet connections are made to ports 40, 41 and 42.

The various fluid-flow configurations and coolant connections provided by the invention allow the heat sinks to be tailored to the cooling requirements of particular semiconductor installations. For example, to successfully employ forced vaporization cooling using a typical coolant such as Freon 113 (trademark), it is important to provide the correct flow rate and coolant pressure and temperature. The flow rate can significantly affect the amount of heat transferred between the coolant and the passage walls in the heat sink. If a series fluid-flow configuration is used, the flow rate is increased and forced vaporization heat transfer is improved. On the other hand, a series arrangement produces a relatively large pressure drop, imposing a penalty on the pressure and temperature parameters governing forced vaporization cooling. The pressure drop associated with series flow thus tends to lower cooling effectiveness. Expermental studies must be conducted to determined the optimum flow configuration for any given forced vaporization semiconductor cooling system.

The heat sink of the present invention provides flexibility which is particularly useful in making forced vaporization cooling systems for thyristors. The expense of constructing a different heat sink for each possible fluid-flow configuration is eliminated by using the invention. Furthermore, the adaptability of the heat sink of the present invention facilitates experimentation directed at developing practical forced vaporization cooling systems.

Alternative embodiments of the heat sink are possible within the scope of the present invention. For example, the number, size and shape of the fluid passageways in the heat sink body could be increased or decreased. Similarly, additional inlet and outlet ports and plugs could be provided to increase the possible fluid-flow configurations available. While the preferred embodiment shown in the figures employs manifolds extending along two sides of the heat sink body, a single manifold with looping fluid passageways could be used. The manifolds could be located exterior of the heat sink body. The shape, size and construction of the plugs used could also be modified within the scope of the present invention.

A fluid cooled heat sink for use in cooling high power semiconductor devices is provided in which the flow of fluid through the heat sink can be conveniently changed to satisfy the cooling requirements of particular devices. A fluid cooled heat sink is provided which is suitable for forced vaporization cooling of high power semiconductor devices. The heat sink can be conveniently adjusted to provide various fluid-flow configurations through the heat sink.

What is claimed is:

1. A fluid cooled heat sink for use in cooling high power semiconductor devices, comprising: a unitary body formed of thermally conductive material, a plurality of fluid passageways in said body, manifold means communicating with said passageways, and mechanically movable means cooperating with said manifold means for selectively interconnecting said passageways to provide various fluid-flow configurations through said body.

2. A fluid cooled heat sink as in claim 1 including a plurality of inlet and outlet ports in said body through which a cooling fluid can enter and exit said body, said ports being selectively closable to facilitate the provision of various fluid-flow configurations.

3. A fluid cooled heat sink as in claim 2 in which at least some of said ports include a tubular connector extending from said body to which a fluid connection is made, said tubular connectors being formed of a malleable material which permits said port to be closed by pinching said tubular connector.

4. A fluid cooled heat sink as in claim 2 in which said ports communicate with said manifold means.

5. A fluid cooled heat sink as in claim 1 in which said means cooperating with said manifold means includes a plurality of movable plugs in said manifold means, each said plug being independently movable into a blocking position wherein said plug prevents fluid communication between selected fluid passageways in said body.

6. A fluid cooled heat sink as in claim 1 in which said body includes first and second opposed sides and first and second manifold means extending along said first and second sides, respectively.

7. A fluid cooled heat sink as in claim 6 in which each said first and second manifold means includes a manifold passage extending generally parallel to the adjacent side of said body, said fluid passageways in said body extending between and opening into said manifold passages.

8. A fluid cooled heat sink as in claim 7 in which said fluid passageways in said body are mutually parallel and are generally perpendicular to said manifold passages.

9. A fluid cooled heat sink as in claim 7 in which each said first and second manifold means includes a plurality of movable plugs spaced along said manifold passage between said fluid passageways, each said movable plug being movable into the manifold passage to block the manifold passage to prevent fluid communication between selected fluid passageways in said body.

10. A fluid cooled heat sink as in claim 9 in which said movable plugs are accessible from outside said body to permit convenient movement of selected plugs into the blocking position in each said manifold passage.

11. A fluid cooled heat sink for use in cooling high power semiconductor devices, comprising: a unitary body formed of thermally conductive material, said body having first and second opposed sides, first and second sides, respectively, each said first and second manifold means including a manifold passage extending generally parallel to the adjacent side of said body, a plurality of fluid passageways in said body extending between and opening into said manifold passages, a plurality of movable plugs spaced along each said manifold passage between said fluid passageways, each said movable plug being movable into the manifold passage to block the manifold passage to prevent fluid communication between selected fluid passageways whereby various fluid-flow configurations through said body are provided.

12. A fluid cooled heat sink as in claim 11 including a plurality of inlet and outlet ports communicating with each said manifold passage in said body, said ports being selectively closable to facilitate the provision of various fluid-flow configurations.

13. A fluid cooled heat sink as in claim 12 in which at least some of said ports include a tubular connector extending from said body to which a fluid connection is made, said tubular connectors being formed of a malleable material which permits said port to be closed by pinching said tubular connector.

14. A fluid cooled heat sink as in claim 11 in which said movable plugs are accessible from outside said body to permit convenient movement of selected plugs into the blocking position in each said manifold passage.

15. A fluid cooled heat sink as in claim 11 in which said fluid passageways in said body are mutually parallel and are generally perpendicular to said manifold passages.

* * * * *

UNITED STATES PATENT AND TRADEMARK OFFICE
CERTIFICATE OF CORRECTION

PATENT NO. : 4,268,850
DATED : May 19, 1981
INVENTOR(S) : Gerald M. Lazarek and Fred W. Staub It is certified that error appears in the above-identified patent and that said Letters Patent are hereby corrected as shown below:

IN THE CLAIMS

Claim 11, column 6, line 10, after the word "sides," insert the following ---first and second manifold means extending along said---.

Signed and Sealed this

Twenty-second Day of September 1981

[SEAL]

Attest:

GERALD J. MOSSINGHOFF

*Attesting Officer*   *Commissioner of Patents and Trademarks*